United States Patent
Higgins, III (10) Patent No.: US 8,946,833 B2
(45) Date of Patent: Feb. 3, 2015

(54) PACKAGING FOR SEMICONDUCTOR SENSOR DEVICES AND METHODS

(71) Applicant: Leo M. Higgins, III, Austin, TX (US)

(72) Inventor: Leo M. Higgins, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 156 days.

(21) Appl. No.: 13/657,250

(22) Filed: Oct. 22, 2012

(65) Prior Publication Data

US 2014/0110801 A1 Apr. 24, 2014

(51) Int. Cl.
*H01L 29/84* (2006.01)

(52) U.S. Cl.
USPC ............................ 257/417; 257/415

(58) Field of Classification Search
CPC ..... G01L 19/147; G01L 19/148; G01L 19/14; G01L 19/0627; G01L 19/0636; G01L 19/0084
USPC .................. 257/414, 415, 417, 418
See application file for complete search history.

(56) References Cited

U.S. PATENT DOCUMENTS 6,401,545 B1 * 6/2002 Monk et al. ............... 73/756
6,740,972 B2 5/2004 Smith et al.
2004/0093954 A1 * 5/2004 Gottlieb et al. ............. 73/754
2009/0278215 A1 * 11/2009 Baldo et al. ............... 257/415
2010/0289055 A1 11/2010 Tan et al.

FOREIGN PATENT DOCUMENTS

| EP | 2034307 A1 | 3/2009 |
| EP | 2423656 A1 | 2/2012 |
| JP | 2000346736 | 12/2000 |
| JP | 2009103602 | 5/2009 |
| WO | 9854556 A2 | 12/1998 |

OTHER PUBLICATIONS

Li, L., et al., "Flexible Nanofiber-Reinforced Aerogel (Xerogel) Synthesis, Manufacture, and Characterization", Applied Materials & Interfaces; www.acsami.org, Published on Web Oct. 23, 2009, vol. I, No. 11, 2009, pp. 2491-2501.
Dow Corning Electronics, "Thermal Fabricated Materials" Electroinics Solutions, Company Presentation, Slide 12, Dow Corning 15XX Gap Pads, TP-1502 Thermal Gap Pad, 2007.
EP Application No. 13188463.3, Search Report dated Mar. 31, 2014.

* cited by examiner

*Primary Examiner* — Hung Vu (57) ABSTRACT

A pressure sensor includes a first housing having a cavity. The pressure sensor further includes a pressure sensing device attached to a bottom of the cavity. The pressure sensor further includes a layer of gel over the pressure sensing device. The pressure sensor further includes a baffle in contact with the gel to reduce movement of the gel.

16 Claims, 6 Drawing Sheets

PACKAGING FOR SEMICONDUCTOR SENSOR DEVICES AND METHODS

BACKGROUND

1. Field

This disclosure relates generally to semiconductor devices, and more specifically, to packaging for semiconductor sensor devices.

2. Related Art

Gel material, particularly silicone gels, are used for encapsulation of micro electro-mechanical systems (MEMS), sensors, and actuators during the packaging process. Frequently, the gel must have a very low modulus to minimize thermomechanical stress on the MEMS, sensor, or actuator element. The application environment for the end product may require resistance to mechanical stress. As an example, a tire pressure monitoring system (TPMS) is subjected to high rates of rotation and the stress the rotation induces. The centrifugal stress will cause a very soft gel that is desired for low thermomechanical stress to move, or flow from the initial area of application and cure, possibly reducing the reliability of the TPMS. As a consequence, a gel with a modulus that is higher than desired from the perspective of minimized thermomechanical stress is used to resist movement or flow during centrifugal testing and in the application environment. The higher modulus gel can induce stresses on wire bonds in the package, which can result in wire breaks with temperature cycle testing and in the operating environment. Further, the increased modulus can impact the performance of the MEMS, sensor, or actuator element with which the gel is in contact. Thus, two conflicting criteria are considered when selecting gel for use in encapsulated devices with wire bonds.

BRIEF DESCRIPTION OF THE DRAWINGS

Embodiments of the present disclosure are illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods are disclosed that include a structural feature in a low modulus gel during the encapsulation stage of the assembly of the MEMS, sensor, or actuator product. Use of a very low modulus gel in the cavity that includes wire bonds between components allows the wire to essentially cut through the gel with little resistance, or stress on the wire during stress testing or in the operating environment. The structural feature(s) reduce movement of the gel and may take the form of a very fine mesh fabric, a random matrix fibrous mat, a pre-formed film, posts, baffles, and/or other structure(s). The structural feature may be integrated into a lid or cavity in the housing of the device, or placed in the housing cavity before or after the cavity has been partially filled with the low modulus gel encapsulant.

Figure 1:
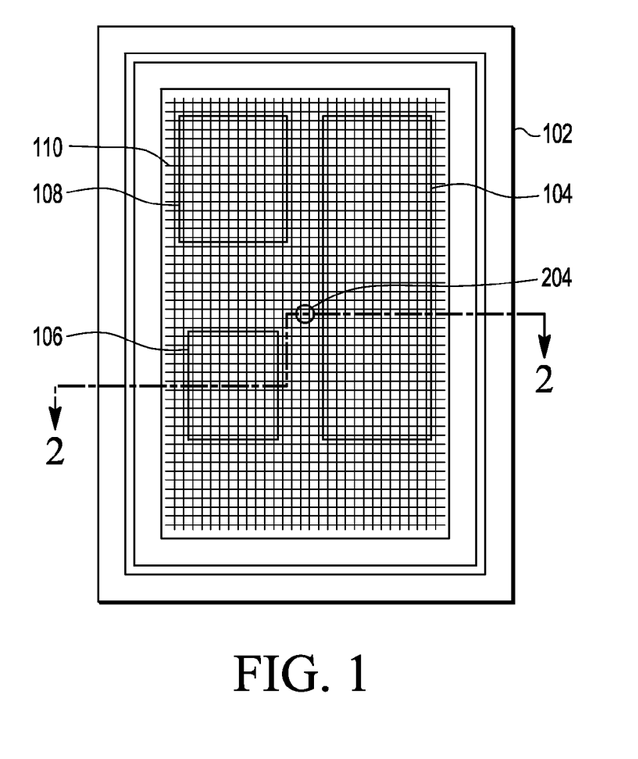
FIG. 1 is a top view of an embodiment of a sensor device in accordance with the present disclosure.
Figure 2:
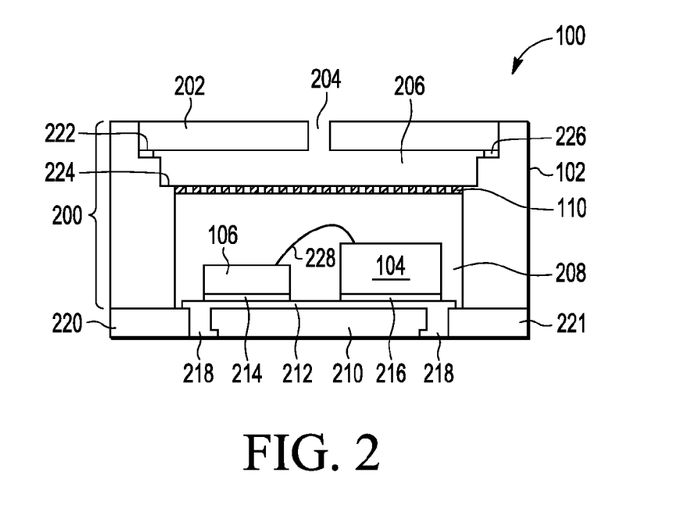
FIG. 2 is a cross-sectional view of the sensor device of FIG. 1.

FIG. 1 is a top view of an embodiment of a sensor device 100 in accordance with the present disclosure. Sensor device 100 includes a quad flat no-lead (QFN) package housing 102, controller 104, pressure sensing device 106, motion sensor 108, and fabric 110. FIG. 2 is a cross-sectional view showing further detail of the sensor device 100 of FIG. 1 including lid 202 with air vent 204, a cavity 200 comprised of air gap 206 and an area for gel 208, metal floor 210, molded floor 212 with legs 218 surrounding metal floor 210, and conductive leads 220, 221 at the lower outer edges of housing 102.

Pressure sensing device 106 and controller 106 are attached to molded floor 212 with respective die attach materials 216, 214. First and second steps 222, 224 are formed at the top of the side edges of the cavity 200 of housing 102. Air gap 206 separates lid 202 from fabric 110 and gel 208. Lid 202 is attached to a top surface of step 222 with a lid attach material 226. Wire bond 228 is formed between controller 104 and pressure sensing device 106. Note that lid 202 is not shown in the top view of FIG. 1, but fabric 110 is shown in the top view of FIG. 1. Fabric 110 can be sized to substantially cover the top surface of cavity 200 at the height of gel 208, with gel 208 wetting and bonding to fabric 110.

Air vent 204 and air gap 206 allows changes in pressure outside of housing 102 to be sensed by pressure sensing device 106. Fabric 110 is placed on top of gel 208 prior to curing the gel to help reduce movement of gel 208 while still allowing changes in pressure to be sensed by pressure sensing device 106 since fabric 110 is flexible enough not to substantially modulate the effect of pressure and pressure variation on pressure sensing element 106. Reducing movement of gel 208 can also help prevent erroneous readings from pressure sensing device 106, as well as help protect wire bond 228 from corrosive environments in air gap 206. Since gel 208 can have a low modulus, fabric 110 also can also help prevent gel 208 from moving into air gap 206, occluding vent hole 204, and escaping through air vent 204.

Fabric 110 can be made from woven filaments of fiberglass, metal, plastic (e.g., polypropylene, nylon, other forms of thermoset and thermoplastic polymers), or other suitable material(s) that would allow fabric 110 to be at least partially submerged at the surface of gel 208. The material comprising the fabric, the surface chemistry of the fabric, and the size of the mesh openings, will affect the wetting of the gel on the fabric 110. These characteristics are selected to allow the gel to thoroughly wet at least one side of the fabric 110, but not permit the fabric 110 to sink deeply into the gel. If the fabric 110 did sink deeply into the gel, fabric 110 may contact wire bonds or a device surface, and the ability of the fabric to constrain movement of the gel during mechanical stress periods will be reduced, especially for the gel that is above the fabric 110 after the gel cure. The fabric buoyancy can be increased by reducing the size of the openings between the filaments in fabric 110, and also by reducing the diameter of the filaments, or changing the surface chemistry of the filaments to reduce surface energy to reduce wetting by the gel.

Any configuration of fabric 110 that helps prevent or retard movement of gel 208 but still allows changes in pressure to be sensed at the required level of sensitivity can be used.

Alternatively, fabric 110 can be a pre-formed solid film that floats on the surface of gel 208. Such a film could be made of a plastic material that is flexible enough to allow the pressure to translate at the needed level of sensitivity but rigid enough to impede movement of the gel.

Figure 3:
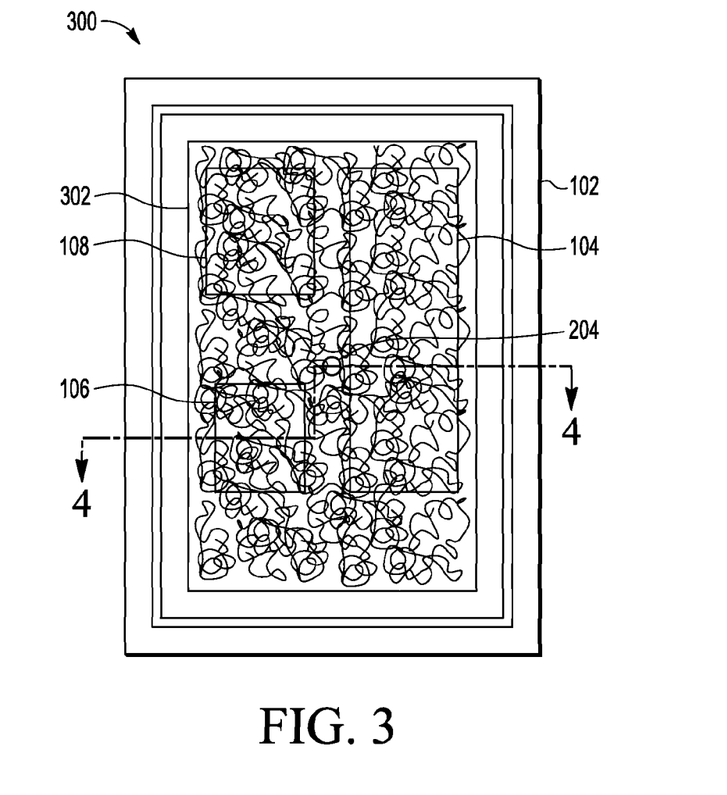
FIG. 3 is a top view of another embodiment of a sensor device in accordance with the present disclosure.
Figure 4:
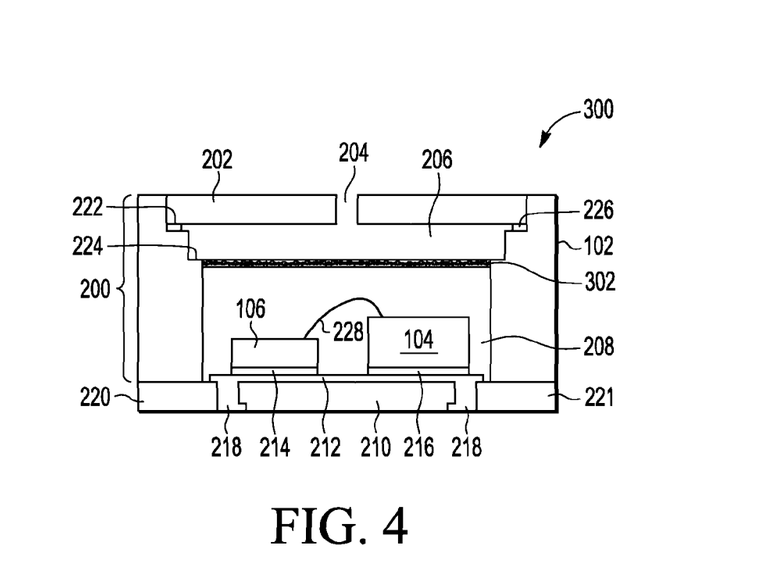
FIG. 4 is a cross-sectional view of the sensor device of FIG. 3.

FIG. 3 is a top view of another embodiment of a sensor device 300 in accordance with the present disclosure. FIG. 4 is a cross-sectional view of the sensor device 300 of FIG. 3 showing non-woven fabric 302 between air gap 206 and gel 208. Non-woven fabric 302 is comprised of one or more strands of material that are bonded together by chemical, mechanical, heat or solvent treatment to form a porous material. Note that lid 204 is not shown in the top view of FIG. 3, but fabric 302 is shown in the top view of FIG. 3.

The material for fabric 302 can be made from fiberglass, metal, plastic (e.g., polypropylene, nylon, other forms of thermoset and thermoplastic polymers), or other suitable material(s) that would allow fabric 302 to be at least partially submerged at the surface of gel 208. One example of a material that is suitable for use as fabric 302 is commercially available under the trade name of CEREX® fabric manufactured by Cerex Advanced Fabrics, Inc. in Cantonment, Fla. Other suitable materials can be used. The material comprising the fabric, the surface chemistry of the fabric, and the size of the openings in the fabric 302, will affect the wetting of the gel on the fabric 302. These characteristics can be selected to allow the gel to thoroughly wet at least one side of the fabric, but not to permit the fabric 302 to sink deeply into the gel. If the fabric 302 did sink deeply into the gel, the fabric 302 may contact wire bonds or a device surface, and the ability of the fabric 302 to constrain movement of the gel during mechanical stress periods will be reduced, especially for the gel that is above the fabric 302 after the gel cure. The buoyancy of fabric 302 can be increased by reducing the size of the openings between the filaments in fabric 302, and also by reducing the diameter of the filaments, or changing the surface chemistry of the filaments to reduce surface energy to reduce wetting by the gel. Any configuration of fabric 302 that helps prevent or retard movement of gel 208 can be used. Fabric 302 can be sized to substantially cover the top surface of cavity 200 at the height of gel 208.

Figure 5:
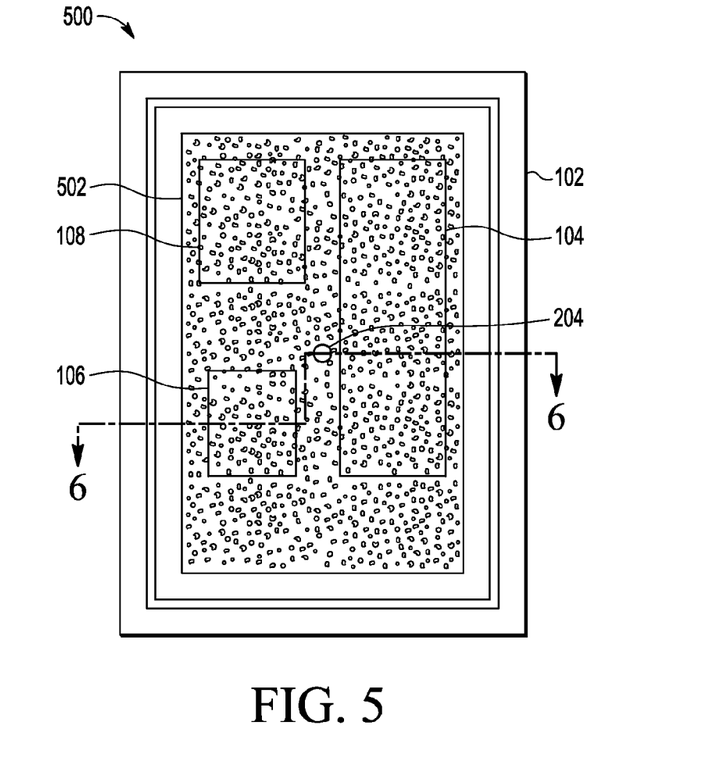
FIG. 5 is a top view of another embodiment of a sensor device in accordance with the present disclosure.
Figure 6:
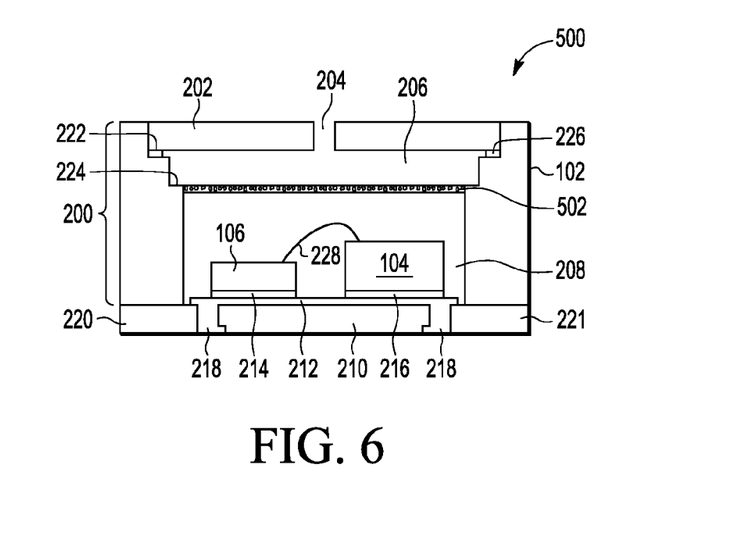
FIG. 6 is a cross-sectional view of the sensor device of FIG. 5.

FIG. 5 is a top view of another embodiment of a sensor device 500 in accordance with the present disclosure. FIG. 6 is a cross-sectional view of the sensor device of FIG. 5. showing surface layer 502 between air gap 206 and gel 208. Surface layer 502 is comprised of short chopped fibers and/or particles, both being forms of particulates, that are suspended in a gel forming a surface layer 502 that has a higher modulus than gel 208. Surface layer 502 is configured to remain at or near the top of gel 208. Note that lid 204 is not shown in the top view of FIG. 5, but surface layer 502 is shown in the top view of FIG. 5.

The fiber and/or particle materials for surface layer 502 can be made from fiberglass, metal, plastic (e.g., polypropylene, nylon, other forms of thermoset and thermoplastic polymers), silica particles or other suitable material(s) that when provided at a suitable loading level in the surface layer 502 of gel 208 that would allow surface layer 502 to be of a thickness and modulus that is able to impede movement of the gel during periods of mechanical stress. Other suitable materials can be used. Any configuration of surface layer 502 that helps prevent or retard movement of gel 208 can be used. Surface layer 502 can be sized to substantially cover the top surface of cavity 200 the height of gel 208.

Figure 7:
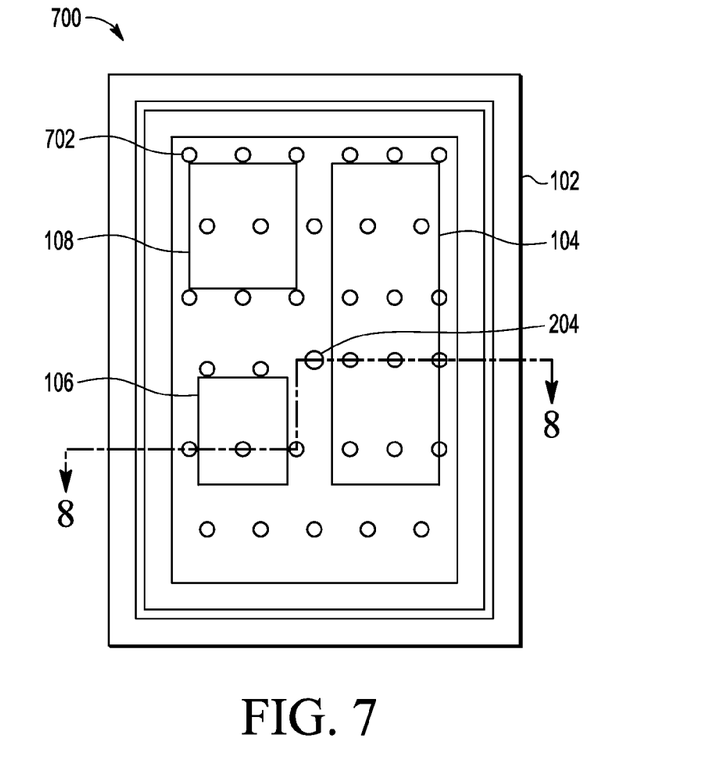
FIG. 7 is a top view of another embodiment of a sensor device in accordance with the present disclosure.
Figure 8:
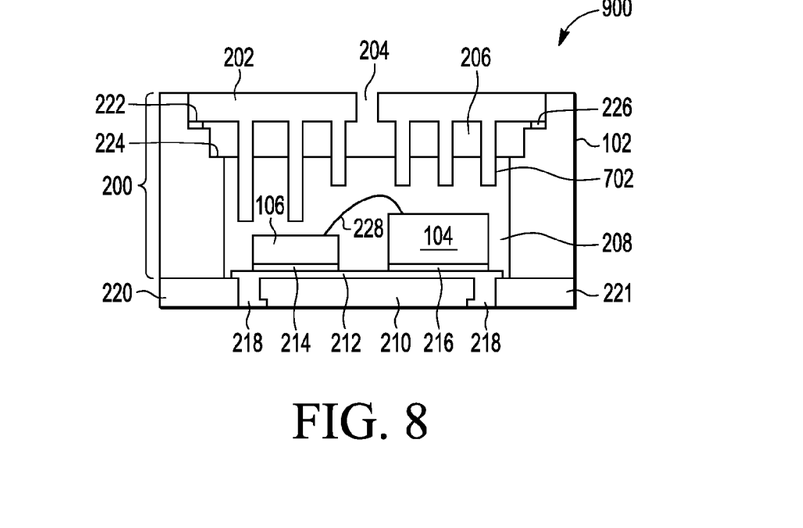
FIG. 8 is a cross-sectional view of the sensor device of FIG. 7.

FIG. 7 is a top view of another embodiment of a sensor device 700 in accordance with the present disclosure. FIG. 8 is a cross-sectional view of the sensor device 700 of FIG. 7. Sensor device 700 includes lid 704 for housing 102 with an array of posts (also referred to as baffles) 702 that extend lengthwise into the cavity 208 of housing 102. Posts 702 are long enough to be at least partially submerged in gel 208 and can have varying lengths, depending on the height of components in housing 102. For example, if the height of controller 104 is greater than the height of sensing device 106, the length of posts 702 over controller 104 can be less than the length of posts 702 over pressure sensing device 106. Any suitable number of posts 702 can be used and may be integrated with lid 704 using a fabrication process such as casting, injection molding, or machining. Lid 704 and posts 702 can be made from metal, engineering plastics such as thermoplastic polymers, liquid crystal polymers, epoxy or other suitable material. Posts 702 can have a round, square, rectangular, or other suitable shape and size that enable posts 702 to act as baffles to help prevent or retard movement of gel 208. Note that lid 704 is not shown in the top view of FIG. 7, but FIG. 5 does show an example of placement of posts 702 in two-dimensions.

Figure 9:
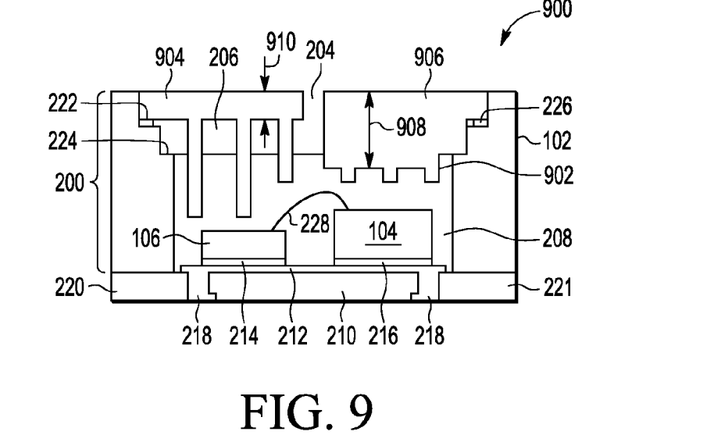
FIG. 9 is a cross-sectional view of another embodiment of a sensor device in accordance with the present disclosure.

FIG. 9 is a cross-sectional view of another embodiment of a sensor device 900 in accordance with the present disclosure in which lid portions 904, 906 for housing 102 include posts 902 similar to posts 702 shown in FIG. 7. Lid portions 904, 906 have different cross-sectional thicknesses 908, 910 that depend on the height of components such as pressure sensing device 106 and controller 104 below corresponding posts 902. In the example shown, the thickness 910 of lid portion 904 over pressure sensing device 106 is less than the thickness 908 of lid portion 906 over controller 104. Lid portion 904 with thickness 910 allows space for air gap 206 between lid portion 904 and the top surface of gel 208 to allow pressure sensing device 106 to sense changes in air pressure due to a change in pressure being exerted on the surface of gel 208. The length of posts 902 under lid portion 904 can vary. Posts 902 are partially submerged in gel 208 under lid portion 904 to help prevent or retard movement of gel 208. Thickness 908 of lid portion 906 is selected so that a lower section of lid portion 906 is submerged in gel 208 or at least touches the surface of gel 208 to help reduce the amount of gel 208 required in cavity 200 as well as to help retard or prevent movement of gel 208. Lid portion 906 can also include posts 902 that act as baffles to further help prevent movement of gel 208. Note that the lid for housing 102 can have more than two portions with different cross-sectional thicknesses. For example a portion of lid (not shown) over motion sensor 108 (FIG. 1) can be the same or different than the thickness 910 of lid portion 904 or the thickness 908 of lid portion 906.

Figure 10:
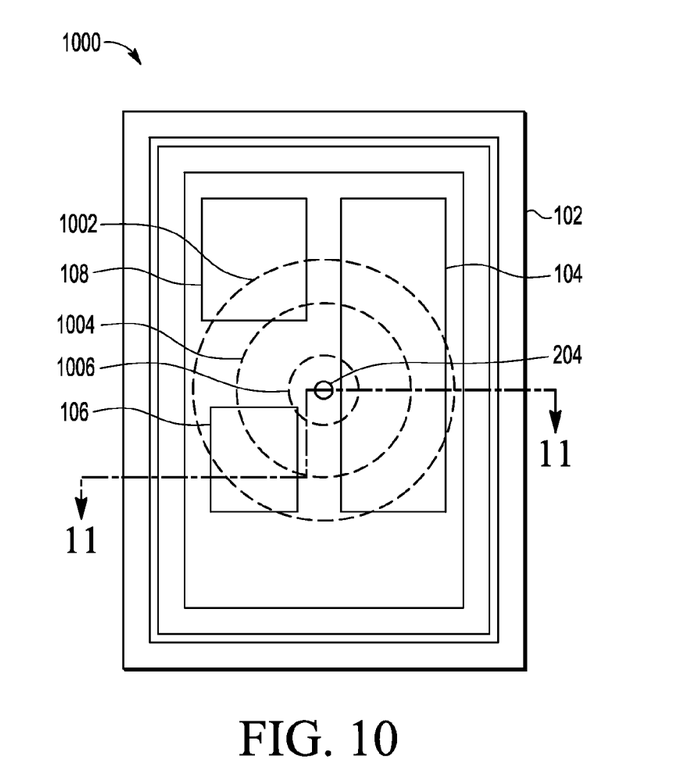
FIG. 10 is a top view of another embodiment of a sensor device in accordance with the present disclosure.
Figure 11:
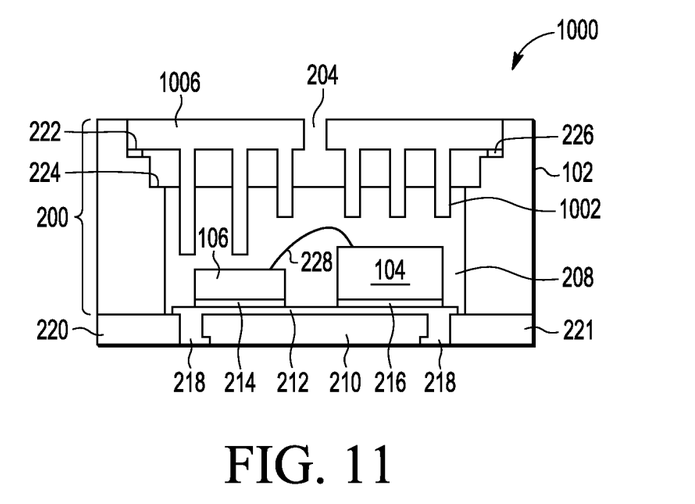
FIG. 11 is a cross-sectional view of the sensor device of FIG. 10.

FIG. 10 is a top view of another embodiment of a sensor device 1000 in accordance with the present disclosure. FIG. 11 is a cross-sectional view of the sensor device 1000 of FIG. 10. Sensor device 1000 includes lid 1006 for housing 102 with concentric arcuate baffles 1002 forming a series of walls that extend lengthwise into the cavity 208 of housing 102. Gaps 1004 in the baffle walls can be positioned between baffles 1002 and can be staggered in relation to gaps in an inner and an outer baffle wall to allow air to flow between baffle walls through the gaps between baffles 1002 but still impede the movement of gel 208, preventing gel 208 from being displaced to an extent that gel 208 does not cover the top of pressure sensing device 106, wire bond 228, and other components surfaces intended to be encapsulated by the gel. Baffles 1002 are long enough to be at least partially submerged in gel 208 and can have varying lengths, depending on the height of components and interconnect elements, such as wire bond 228, in the housing. The lid 1006 may be bonded to the housing 102 with adhesive 226 prior to curing gel 208, or, since gel 208 can have a low modulus, the lid 1006 may be bonded after curing gel 208. Any suitable number of baffles 1002 can be used and may be integrated with lid 1006 using a fabrication process such as injection molding or casting. Lid 1006 and baffles 1002 can be made from metal, engineering plastics such as thermo plastic polymers, liquid crystal polymers, epoxy, other forms of thermoset polymers or other suitable material. Note that lid 1006 is not shown in the top view of FIG. 10, but FIG. 10 does show an example of a layout of baffles 1002 in two-dimensions. It is understood that baffles 1002 may also be arranged in patterns that are not in an arcuate arrangement, such as a linear or rectangular arrays, and such arcuate, linear, rectangular, and other forms of arrays of baffles, may be combined to form a wide range of baffle configurations.

By now it should be appreciated that in some embodiments, a pressure sensor comprises a first housing having a cavity, a pressure sensing device attached to a bottom of the cavity, a layer of gel over the pressure sensing device, and a baffle in contact with the gel to reduce movement of the gel.

In another aspect, the baffle comprises fabric on a top surface of the layer of gel.

In another aspect, the fabric comprises a flexible woven material.

In another aspect, the fabric comprises a flexible non-woven material.

In another aspect, the baffle comprises a high modulus surface layer on the layer of gel.

In another aspect, the high modulus surface layer comprises gel and particulate that causes the high modulus surface layer to have a higher modulus than the layer of gel.

In another aspect, the baffle comprises a lid over the cavity, the lid is spaced above the layer of gel, the lid has an opening, and the baffle further comprises posts extending from the lid into the gel.

In another aspect, the baffle comprises a lid. The lid is over the cavity and has a portion extending to at least a portion of a top surface of the layer of gel, and the lid has an opening.

In another aspect, the portion of the lid has posts extending further into the gel.

In another aspect, the baffle comprises a lid having an opening and a plurality of wall baffles. Each wall baffle surrounds the opening. Each wall baffle extends from the lid, and for each wall baffle there is a path for air to move from one side of the wall opposite the opening to the opening.

In other embodiments, a pressure sensor comprises a first housing having a cavity, a pressure sensing device attached to a bottom of the cavity, a layer of low modulus gel over the pressure sensing device and in the cavity, and moderating means for moderating movement of the gel.

In another aspect, the pressure sensor includes a lid with an opening. The moderating means comprises one of a group consisting of a fabric on a top surface of the gel and a moderating layer on the top surface of the gel comprising gel and a particulate so that the moderating layer has a higher modulus than the layer of low modulus gel.

In another aspect, the moderating means comprises a lid with an opening. The lid is over the cavity and is spaced from a top surface of the layer of gel. The moderating means has an extension means from the lid to the layer of gel for contacting the layer of gel.

In another aspect, the extension means has a surface that contacts at least a portion of the top surface of the layer of gel.

In another aspect, the extension means has a plurality of posts extending from the lid to extend into the layer of gel.

In another aspect, the extension means has a plurality of wall baffles. Each of the wall baffles surrounds the opening and is configured to allow passage of air through the opening and a side of the wall baffle opposite the opening.

In yet other embodiments, a method comprises forming a pressure sensor device in a cavity, forming a layer of gel over the pressure sensor device, and contacting the gel with a baffle comprising one of group consisting of a structure that lies on a top surface of the gel and a structure that extends under the top surface of the gel.

In another aspect, the step of contacting the gel comprises forming a lid having an opening and extending the structure from the lid.

In another aspect, the method further comprises forming a lid over the cavity, wherein the opening is over the pressure sensor device.

In another aspect, the step of contacting includes forming on a top surface of the gel one of a group consisting of a fabric and a moderating layer comprising gel and a particulate so that the moderating layer has a higher modulus than the layer of low modulus gel.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A pressure sensor, comprising:
   a first housing having a cavity;
   a pressure sensing device attached to a bottom of the cavity;
   an electrical connection coupled between the pressure sensing device and another component in the cavity;
   a layer of gel, the pressure sensing device and at least a portion of the electrical connection being buried in the layer of gel;
   a lid over the layer of gel; and a baffle in the cavity in contact with the layer of gel to reduce movement of the gel across the electrical connection.

2. The pressure sensor of claim 1, wherein the baffle comprises fabric on a top surface of the layer of gel.

3. The pressure sensor of claim 2, wherein the fabric comprises a flexible woven material.

4. The pressure sensor of claim 2, wherein the fabric comprises a flexible non-woven material.

5. The pressure sensor of claim 1, wherein the baffle comprises a high modulus surface layer on the layer of gel.

6. The pressure sensor of claim 5, wherein the high modulus surface layer comprises gel and particulate that causes the high modulus surface layer to have a higher modulus than the layer of gel.

7. The pressure sensor of claim 1, wherein:
the lid has an opening; and
the baffle further comprises posts extending from the lid into the gel.

8. The pressure sensor of claim 1, wherein:
the lid is over the cavity;
the lid has a portion extending to at least a portion of a top surface of the layer of gel; and
the lid has an opening.

9. The pressure sensor of claim 8, wherein the portion of the lid has posts extending further into the gel.

10. The pressure sensor of claim 1, wherein the lid has an opening:
the baffle further comprises a plurality of wall baffles;
each wall baffle surrounds the opening;
each wall baffle extends from the lid; and
for each wall baffle there is a path for air to move from one side of the wall opposite the opening to the opening.

11. A pressure sensor, comprising:
a first housing having a cavity;
a pressure sensing device attached to a bottom of the cavity;
an electrical connection in the cavity between the pressure sensing device and another component;
a layer of low modulus gel in the cavity, the pressure sensing device and at least a portion of the electrical connection are buried in the gel;
a lid over the layer of low modulus gel; and
a baffle for moderating movement of the gel across the electrical connection and the pressure sensing device, wherein the baffle is in contact with the layer of low modulus gel in the cavity.

12. The pressure sensor of claim 11, wherein the lid includes an opening, and the baffle comprises one of a group consisting of a fabric on a top surface of the gel and a moderating layer on the top surface of the gel comprising gel and a particulate so that the moderating layer has a higher modulus than the layer of low modulus gel.

13. The pressure sensor of claim 11, further comprising:
the lid includes an opening:
the lid is over the cavity;
the lid is spaced from a top surface of the layer of gel; and
the baffle extends from the lid to the layer of gel for contacting the layer of gel.

14. The pressure sensor of claim 13, wherein the baffle has a surface that contacts at least a portion of the top surface of the layer of gel.

15. The pressure sensor of claim 13, wherein the baffle has a plurality of posts extending from the lid to extend into the layer of gel.

16. The pressure sensor of claim 13, wherein:
the baffle has a plurality of wall baffles;
each of the wall baffles surrounds the opening;
each of the wall baffles is configured to allow passage of air through the opening and a side of the wall baffle opposite the opening.

* * * * *